(12) United States Patent
Naim

(10) Patent No.: US 7,667,944 B2
(45) Date of Patent: Feb. 23, 2010

(54) POLYCERAMIC E-CHUCK

(75) Inventor: Mahmood Naim, Salt Point, NY (US)

(73) Assignee: Praxair Technology, Inc., Danbury, CT (US)

( * ) Notice: Subject to any disclaimer, the term of this patent is extended or adjusted under 35 U.S.C. 154(b) by 22 days.

(21) Appl. No.: 11/823,978

(22) Filed: Jun. 29, 2007

(65) Prior Publication Data
US 2009/0002913 A1    Jan. 1, 2009

(51) Int. Cl.
H01T 23/00    (2006.01)
(52) U.S. Cl. .................... 361/234; 361/230
(58) Field of Classification Search .......... 361/230–234
See application file for complete search history.

(56) References Cited

U.S. PATENT DOCUMENTS

| | | | |
|---|---|---|---|
| 5,155,652 A | 10/1992 | Logan et al. | |
| 5,191,506 A | 3/1993 | Logan et al. | |
| 5,207,437 A | 5/1993 | Barnes et al. | |
| 5,384,682 A | 1/1995 | Watanabe et al. | |
| 5,426,558 A | 6/1995 | Sherman | |
| 5,522,131 A | 6/1996 | Steger | |
| 5,886,863 A | 3/1999 | Nagasaki et al. | |
| 6,028,762 A | 2/2000 | Kamitani | |
| 6,272,002 B1 * | 8/2001 | Mogi et al. | 361/234 |
| 6,378,600 B1 | 4/2002 | Moslehi | |
| 6,490,145 B1 | 12/2002 | Kholodenko et al. | |
| 6,754,062 B2 * | 6/2004 | Logan et al. | 361/234 |
| 6,791,817 B2 | 9/2004 | Allison et al. | |
| 7,209,339 B2 | 4/2007 | Kitabayashi et al. | |
| 2005/0215073 A1 * | 9/2005 | Nakamura et al. | 438/778 |
| 2007/0047170 A1 * | 3/2007 | Sun et al. | 361/234 |
| 2008/0037195 A1 * | 2/2008 | Himori et al. | 361/234 |

FOREIGN PATENT DOCUMENTS

WO    WO 00/28588    5/2000

* cited by examiner

Primary Examiner—Danny Nguyen
(74) Attorney, Agent, or Firm—Iurie A. Schwartz

(57) ABSTRACT

The present invention discloses an electrostatic chuck for clamping work substrates, said chuck comprising three layers, where the dielectric constant of included non-conductive layers is selected to provide overall lower capacitance to the chuck. In the chuck assembly of the present invention, the top dielectric layer that is in contact with a substrate, such as, a wafer, has a dielectric constant that is preferably greater than about 5, with a resistivity that is preferably greater than about 1E6 ohm.m, whereas the bottom dielectric layer has a dielectric constant that is preferably less than about 5 and a resistivity that is preferably greater than about 1E10 ohm.m. The intermediate layer preferably has a conductive layer where the resistivity is less than about 1 ohm.m.

28 Claims, 4 Drawing Sheets

POLYCERAMIC E-CHUCK

FIELD OF THE INVENTION

The present invention, in general, is directed to electrostatic chucks (e-chucks) for use in semi-conductor manufacturing. More specifically, the present invention is directed to the use and manufacture of improved multilayer electrostatic and ceramic chucks, each layer preferably having varying dielectric constants and resistivities.

BACKGROUND OF THE INVENTION

Electrostatic chucks are known devices used in semiconductor manufacturing processes. Such chucks eliminate the need for the prior used mechanical clamping devices that were often difficult to use with precision, and often introduced contaminants to the semiconductor manufacturing chambers. Chucks support the substrates within the semiconductor wafer manufacturing or processing chamber. Designers have developed electrostatic chucks that comprise ceramics in combination with an embedded metallic conductor. These chucks are often referred to as "ceramic chucks". Ceramic chucks hold an electrostatic charge that secures a substrate, such as a wafer in a semiconductor manufacturing chamber. Some designs rely upon an adhesive-type bonding of the assembly to secure the metallic conductor within multiple ceramic layers, and to form the chuck.

Known devices contain multilayer ceramic components supported on a metallic base. However such known designs have prolonged charging and discharging periods of up to 10 seconds or longer. Such charging and discharging periods are viewed as impractical in most modern semiconductor manufacturing processes that require faster throughput. Indeed, metal bases in the chuck construction are prone to electrical bridging or arcing that can result in leakage between electrodes and the base. Such arcing can drain off the stored charge that holds the work piece in place, and exposed metal base results in arcing damage in plasma chambers.

Hybrid chucks have been developed for securing work pieces with an electrostatic charge. Commonly owned U.S. Pat. No. 6,754,062 discloses such a hybrid chuck comprising a dielectric base for supporting the hybrid chuck. The hybrid chuck itself includes a top surface with a conductive covering layer that covers at least a portion of the top surface of the dielectric base. The conductive layer receives a current creating an electrostatic charge and is non-metallic for maintaining the charge without significant eddy current losses in the presence of dynamic electromagnetic fields present during semiconductor manufacturing. The top working surface covers the conductive layer and is flat for holding work pieces upon receiving current to create the electrostatic charge in the conductive layer.

However, in the design of electrostatic chucks, it is increasingly desirable to reduce the total capacitive load on the semiconductor tools using the electrostatic chucks. Known chucks have not provided such a desired reduction. Further, the problem of arcing with known electrostatic chucks has not been completely addressed as metal base heat sink arcing typically occurs to some extent. An improved electrostatic chuck that addresses these issues would be highly advantageous.

SUMMARY OF THE INVENTION

According to one embodiment, the present invention is directed to an electrostatic chuck for securing work pieces with an electrostatic charge, the chuck comprising a top dielectric layer designed to be in contact with a work piece. The top dielectric layer has a dielectric constant that is from about 5 to about 10, and has a resistivity between about 1E6 ohm.m and about 1E15 ohm.m. The chuck further comprises a bottom dielectric layer having a dielectric constant that is preferably from about 2 to about 7, and has a resistivity of from about 1E10 ohm.m to about 1E15 ohm.m. The chuck further comprises an intermediate layer having a resistivity of from about 1.5E-8 ohm.m to about 1 ohm.m.

BRIEF DESCRIPTION OF THE DRAWINGS

Other objects, features, embodiments and advantages will occur to those skilled in the field from the following description of preferred embodiments and the accompanying drawings, in which.

DETAILED DESCRIPTION OF THE INVENTION

Figure 1:
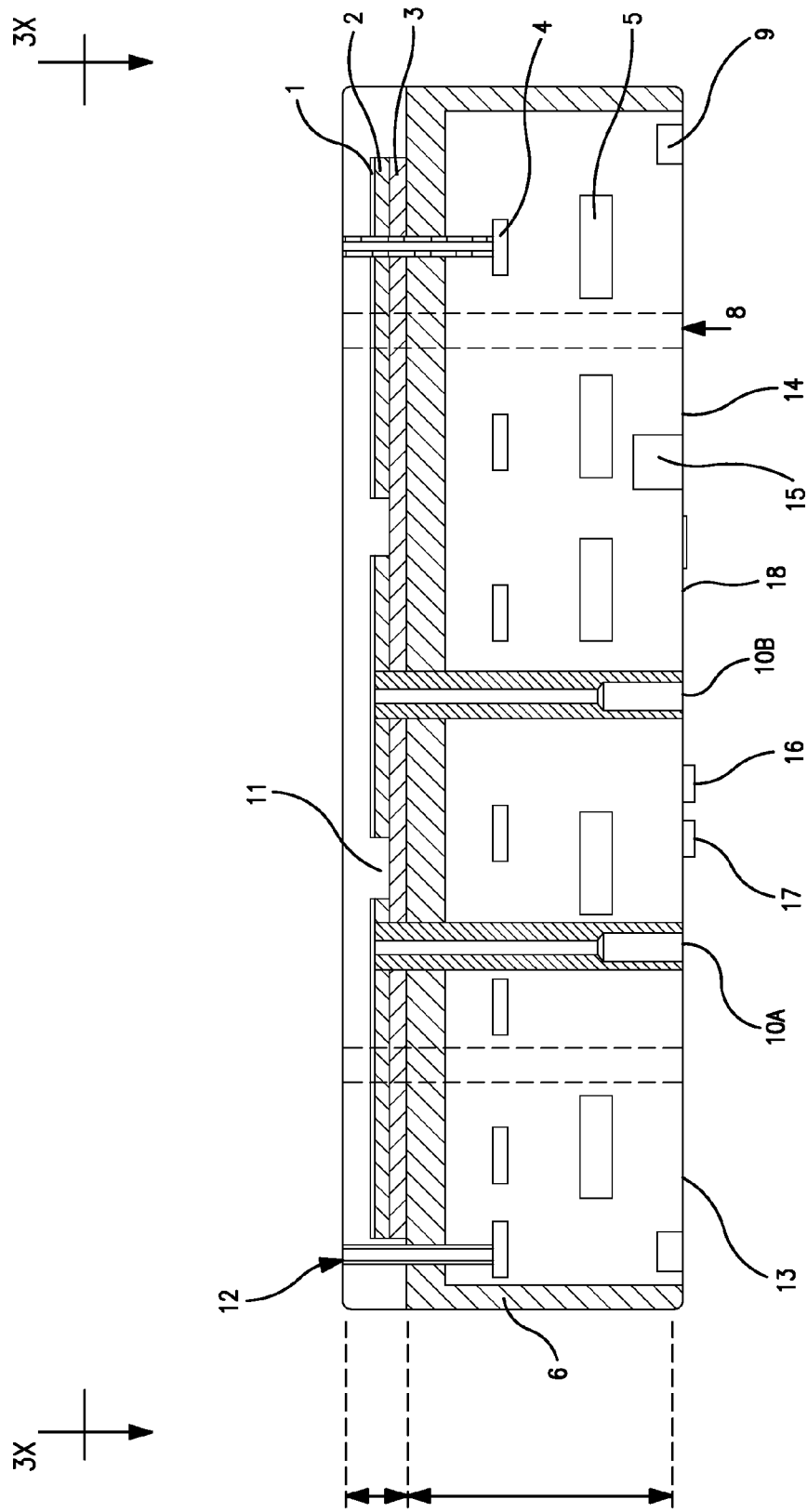
FIG. 1 shows a cross-sectional side view of one embodiment of the present invention.

The present invention discloses an electrostatic chuck, or e-chuck comprising three layers, where the dielectric constant of included non-conductive layers is selected to provide overall lower capacitance to the chuck. In the chuck assembly of the present invention, the top dielectric layer that is in contact with a wafer, has a dielectric constant that is from about 5 to about 10, preferably from about 8 to about 10, with a resistivity from about 1E6 ohm.m to about 1E15 ohm.m, whereas the bottom dielectric layer has a dielectric constant that is preferably from about 2 to about 7, more preferably from about 3 to about 5, and a resistivity that is from about 1E10 ohm.m to about 1E15 ohm.m. The intermediate layer has a conductive layer having a resistivity of from about 1.5E-8 ohm.m to about 1 ohm.m.

The ability to more precisely select and tune composite layer properties of the chuck, such as those properties presented immediately above, allows for manufacturing an electrostatic chuck where the top dielectric layer can be, for example, a ceramic material such as, for example, from the family of oxides, nitrides and alloys or composites thereof. These materials are preferably aluminum oxide, silicon dioxide, zirconium oxide, yttrium oxide, beryllium oxide, aluminum nitride, boron nitride, silicon nitride, doped ceramics etc. and mixtures thereof. The bottom layer dielectric should be a polymer, or a low dielectric (K) ceramic, with K preferably in the range of from about 2 to about 7, and more preferably from about 3 to about 5. Examples of such useful materials include polyimide, fluorocarbons, siloxanes, $SiO_2$, etc.

The chucks designed according to embodiments of the present invention consist of a top dielectric layer which has a relatively high dielectric constant. The chuck is designed with features for distribution of cooling gases, lift pin holes, grounding contacts, sensor holes, etc. The top contact surface may preferably have a mesa structure created to enhance wafer backside cooling and reduce particle transfer to the wafer.

The intermediate conductor layer can be made of any material having a resistivity that is preferably less than about 1 ohm.m, such as, for example W, Ti, Mo, Ta, Al, Ag, Cu, Nb, ITO, $Al_2O_3$—$TiO_2$, conductive polymers, etc. and mixtures thereof. The electrode configuration is designed to increase the energy stored in the chuck, which behaves, in part, as a capacitor. The conductor can be configured as monopole, bipole or multipole structure. A bipolar structure of equal areas to balance the capacitance is particularly desirable.

According to further embodiments of the present invention, the bottom layer of the chuck preferably is a dielectric layer made of a polymer. The polymer preferably has a dielectric constant of from about 2 to about 7, preferably from about 3 to about 5. The polymer is preferably a polyimid film, a fluropolymer film or a siloxane film. The polymer layer can be an adhesive, a dielectric gel, silicone based adhesive, heat curable or UV curable adhesive, catalytic activated or anaerobic cured adhesive, etc. Ceramic filled adhesives are preferred, as they can be used to adjust dielectric properties. The bottom layer must have the ability to withstand breakdown voltages with a minimum of about 450 Volts/mils (17 KV/mm). The preferred ceramic fillers are dielectric materials, such as, for example, aluminum oxide, silicon dioxide, magnesium oxide, boron nitride, silicon nitride, etc. Ceramic fillers made of boron nitride and aluminum nitride are particularly preferred where enhanced heat transfer is desired.

The preferred three layered e-chuck structure of the present invention can be adhered to a metal or a ceramic base, as desired. Ceramic bases are used where high heat transfers are not essential, or where a thick film ceramic heater is desired to be in the vicinity of the e-chuck. The metal base heat sink is desired when higher heat transfer rates are required in a process. The metal base may have a cast heater in addition to coolant passages for the flow of fluids or gases as needed. The metal base can also act as an RF electrode or a reference electrode. The base can be designed as a heat sink with passages for coolant and passages to bring another coolant to the backside of the wafer through trenches and holes. The base metal can be protected from arcing by providing a coating of aluminum oxide deposited on the surfaces where arcing can occur. This anti-arc coating is preferably deposited by a plasma spray technology. In addition to plasma sprayed coatings of a dielectric material, the heat sink, when made from aluminum, may be anodized to form a film of anodized aluminum in the areas that are exposed to lower voltages.

Another important advantage of the invention is that the use of a polymer as a bottom layer dielectric, when adhered to a metal base, does not require thermal matching between a ceramic and a metal when bottom dielectric is a ceramic, as is the case with most conventional chucks. According to the present invention, the polymer adhesive layer can expand or contract independent of the ceramic thereby reducing thermal stresses.

Some known electrostatic chucks may use ceramics as their top and bottom layer dielectric. According to embodiments of the present invention, the top layer comprises a ceramic, however the bottom dielectric layer is a polymer. Preferably, the polymer is filled with a ceramic. This polyceramic layer allows for better control of capacitive budget in a given application. The polymeric layer also provides relief of stresses from a potential differential thermal expansion of the top ceramic layer and the bottom metal heat sink. The polyceramic structure can be bonded to a metal, and the metal can be protected by a thermal sprayed coating of a dielectric material such as, for example, alumina, yttria, magnesia, titania and other alloyed dielectric ceramics, etc.

The electrostatic chucks of the present invention control capacitive load presented by a chuck in a semiconductor chamber. By reducing capacitance, the reactive capacitance component is decreased, thus easing the typical difficulty in matching the RF load of various components. The chucks of the present invention may be manufactured at a lower fusion temperature compared to conventional chucks, leading to a significantly lower manufacturing times and commensurate manufacturing cost. The use of polymer or ceramic filled polymer adhesive allows the layers in the chuck to be bonded to a heat sink without the need for matching the thermal expansion of the component layers. Most materials that have low thermal expansion also have lower thermal conductivity, as such thermal matching to ceramics also reduces thermal conductivity of the heat sink. If thermal matching is not required in a manufacturing process for chucks, then materials with high thermal conductivity can be selected for heat sink, as proposed in embodiments of this invention.

The polyceramic chucks of the present invention can provide a low cost solution to chuck manufacturing, as such chucks require lower compensation for capacitive reactance, thereby reducing cost of the RF matching network. The chucks of the present invention have anti-arc features that provide long life and low cost of ownership. FIG. 1 shows, in cross-section, a preferred polyceramic e-chuck made according to preferred embodiments of the present invention. Such a structure can be manufactured by using a sintered ceramic top dielectric layer (1) made of aluminum oxide of at least about 99.5% purity with an isolation rib structure (11) machined to provide for electrical isolation to segmented electrodes (2). The electrodes (2) are deposited by sputtering tungsten within the isolation rib structure (11). Electrodes may also be formed by metallization of the ceramics. The electrode (2) is then encapsulated with a polyceramic adhesive (3) and this ceramic, metal and polyceramic layered structure is then bonded to the metal heat sink (14). The heat sink (14) is made of 6061Al or other suitable thermally conductive alloy. The heat sink comprises cooling gas channels (4) that are fed with a cooling gas from an inlet (18) at the base of the heat sink. The heat sink is brazed to form a cooling fluid channel (5) that has inlet (16) and outlet (17) for connections to a thermal controller, such as, for example, a chiller. The heat sink is coated with a layer of a dielectric material like aluminum oxide using a thermal spray device referred to as anti-arc coating (6). Dielectric material, such as, for example, a sintered ceramic, or thermal spray coating may be used on the top surface (19) of the heat sink (14). The backside or the areas of the aluminum heat sink exposed to low voltages are anodized (13). The bonded ESC is connected to DC power pins (10A) and (10B) through the heat sink (14). The power pins (10A, 10B) are used to energize the segmented electrode (2). One or more power pins may be used for the corresponding segmented electrodes as required for a monopolar or multipolar e-chuck. The heat sink (14) has thru holes (8) for lift pins. These thru holes are preferably lined with a dielectric material like aluminum oxide. The electrostatic chucks are used in vacuum chambers as such they require O-rings (9) to seal the chamber against atmosphere. The heat sink (14) has a provision for application for RF connection (15).

Figure 2:
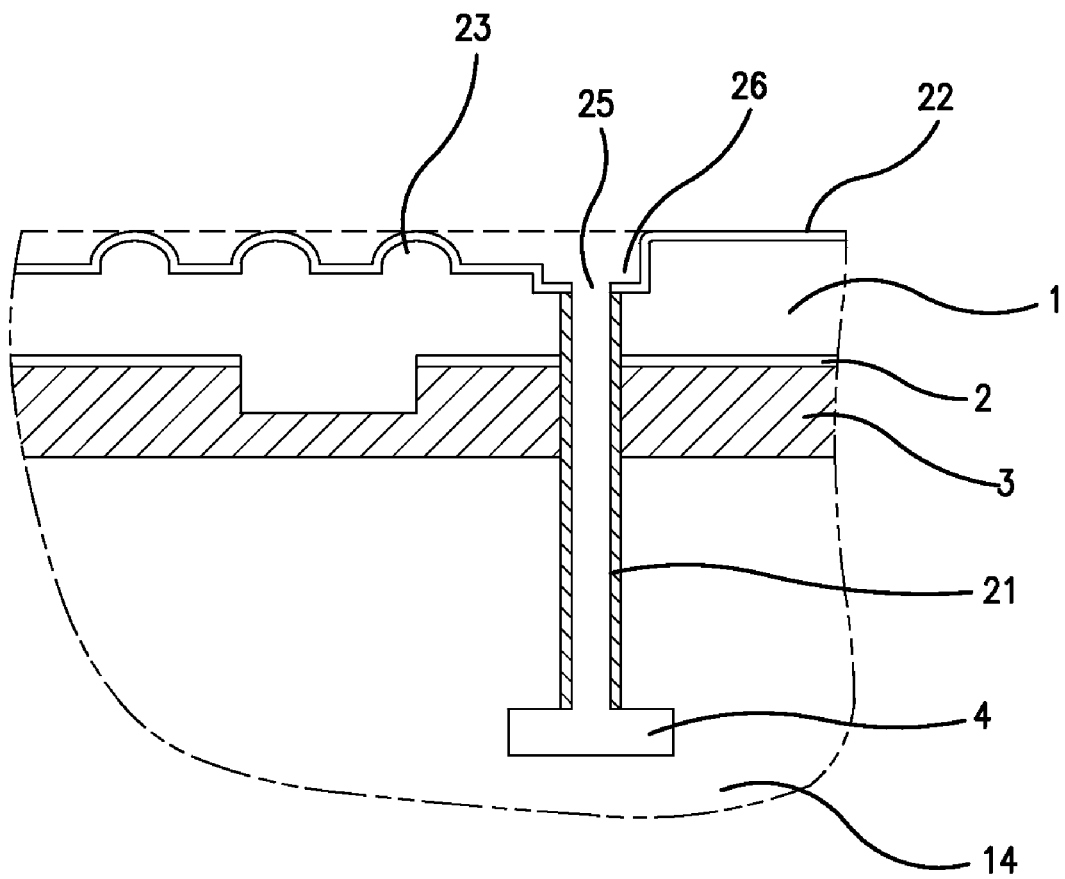
FIG. 2 shows a cross-sectional side view of an embodiment of the present invention showing the mesa surface, gas grooves and ceramic lined gas holes in the chuck attached to a heat sink (as shown in FIG. 1 taken along line 3-3).

FIG. 2 shows details of the wafer clamping surface in cross-section. In addition a key feature of this invention is shown where the cooling gas passage is lined with a dielectric material (21), for example, a ceramic or a polymer. The presence of a dielectric insert inside the gas holes (25) prevents arcing to the base metal or heat sink (14) from any plasma arcing that may develop underneath a wafer due to the bias voltage imposed on the wafer. Another key feature of the invention shown is the mesa structure (23) along with gas grooves (26) on the wafer clamping surface (22). The mesa structures (23) are integral parts of the top dielectric surface. However, mesa structures (23) also may be deposited on the dielectric surface by various thin film deposition techniques like PVD or CVD, as would readily be understood by those skilled in the field of thin film material deposition. Integral mesa structures (23) may be encapsulated in conformal films, with such films made from materials including, for example, carbon, silicon dioxide, silicon nitride, aluminum nitride, polyimid, flouorocarbons of siloxanes, combinations thereof, etc.

Mesa structures are provided to reduce the area of contact in a range of from about 1% to about 25%. The reduction in contact area results in a decrease in clamping force, but provides an advantage to gain quick release time. The mesa structure also reduces the number of particles transferred to the backside of a wafer, due to decrease in area of contact. In addition, mesa structure allows for, among other things, distribution of cooling gas behind the wafer surface during wafer clamping, thus enhancing heat transfer from the wafer to the top dielectric surface.

Figure 3:
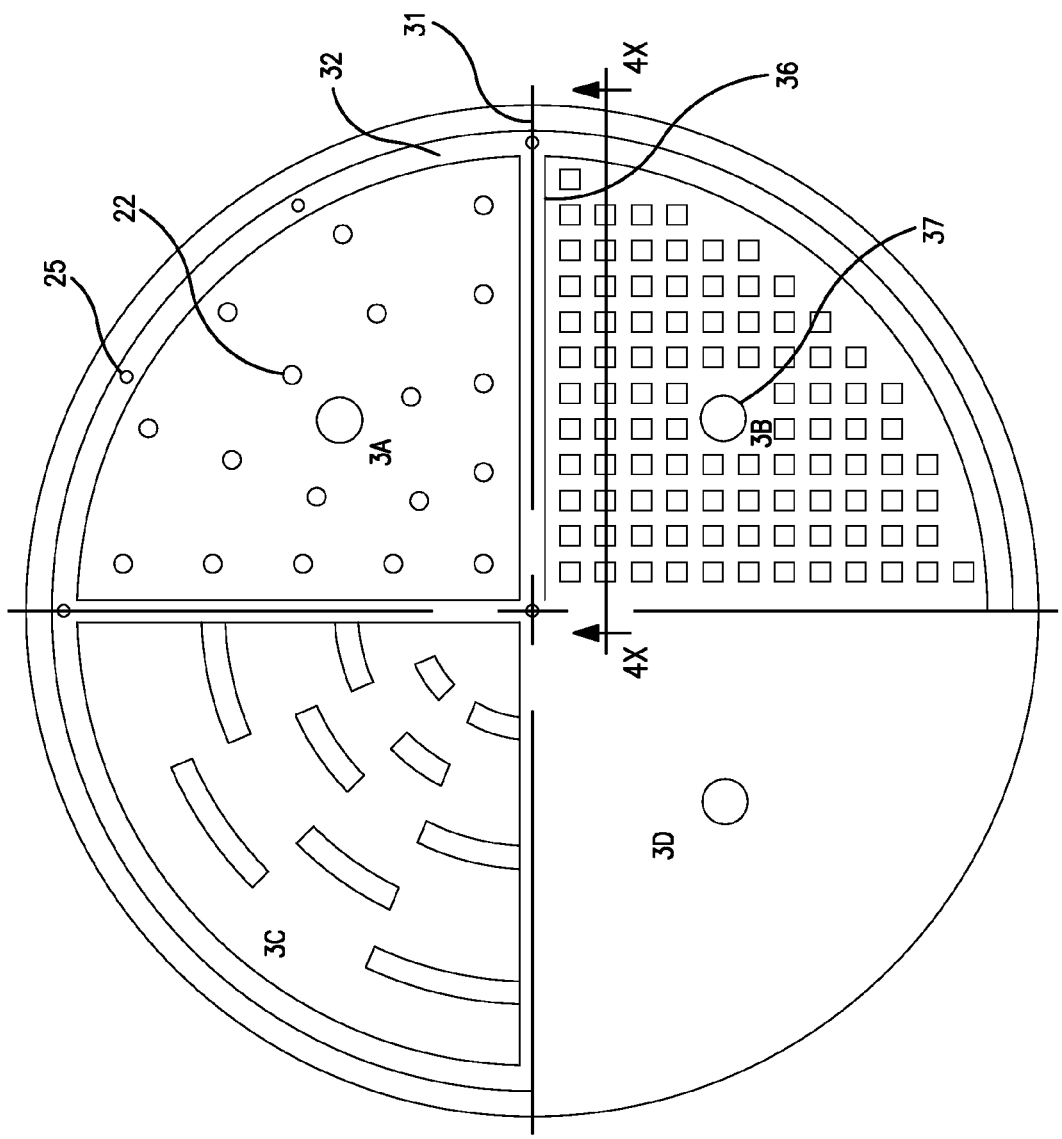
FIG. 3 shows an overhead view of the wafer clamping surface of one embodiment of the present invention where the surface has various mesa structures, gas grooves, gas holes and thru holes for wafer lift pins or wafer grounding pins.
Figure 4:
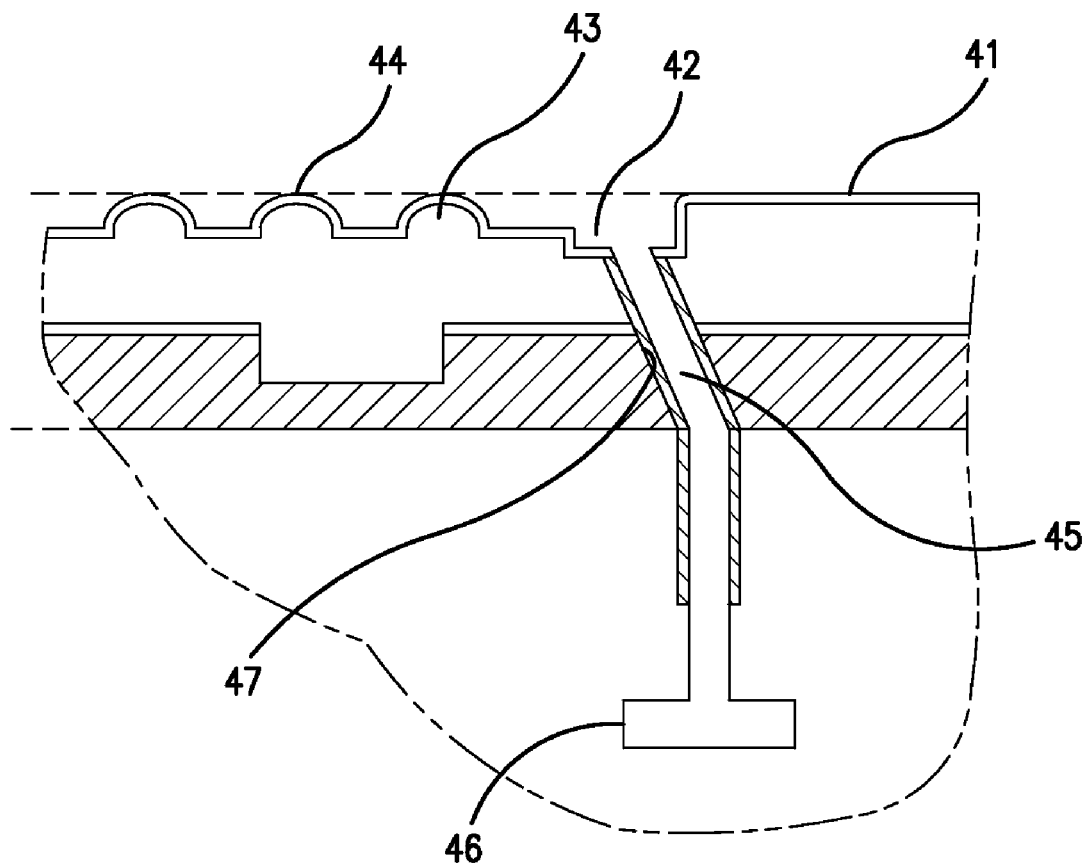
FIG. 4 shows a cross-sectional side view of the wafer/chuck arrangement having a mesa surface comprising a conformal film. The gas feed hole is shown angled in line with a ceramic insulator to prevent arcing (as shown in FIG. 3 taken along line 4-4).

FIG. 3 shows top surface of a polyceramic e-chuck. The same surface is shown in cross-section in FIG. 4. The key features are gas sealing surface, or wafer clamping surface (31), thru holes (37) to provide for lift pins to raise or lower a wafer or grounding pins to contact a wafer, a pattern of circular gas grooves (32) and radial gas grooves (36) for uniform pressure distribution of backside cooling gas, mesa structure (33) where mesa may be circular (3A) or rectangular (3B), or elongated trapezoidal pads (3C) and a series of gas holes (35) that are connected to cooling gas channels (as shown in FIG. 2 (4) or FIG. 4 (46)) via gas feed holes, FIG. 2 (21) or FIG. 4 (45). The gas holes may preferably be lined with dielectric insulators, FIG. 2 (21) or FIG. 4 (47) in the heat sink. The mesa structure may be formed or encapsulated with a conformal film (44) made of carbon, silicon dioxide, silicon nitride or aluminum nitride, polyimid, fluorocarbons or siloxanes, etc. The presence of the conformal film allows for reduction in particle transfer to the backside of the wafer. FIG. 4 also shows a variation in the gas feed holes where the gas feedholes (45) are lined with an insulator (47) at an angle to the clamping surface of 2 degrees to 45 degrees from the normal. The angular insulated gas feed holes allow the e-chuck to run high bias processes without arcing inside the gas feed holes. The length of the insulator (47) is varied based on the amount of bias voltage for a given process.

In a semiconductor process chamber, such as, for example, an etch chamber, the e-chuck bonded to the heat sink is installed in a vacuum chamber. The heat sink is connected to a dielectric coolant at locations (16) and (17) shown in FIG. 1. A cooling gas flow, for example, helium flow, is then connected to the cooling gas inlet (18). RF power is applied to the heat sink at location (15). The e-chuck electrodes (2) are energized with DC or AC power at locations (10A) and (10B). During operation, a wafer is preferably brought into the vacuum chamber in mechanized fashion, such as, for example, with a robotic arm and placed on lift pins. The lift pins are then lowered, and the chucking voltage is applied to clamp the wafer in place. The robotic arm and lift pins are retracted. A backside gas, such as, for example, helium is preferably turned on to a backside pressure of 5 torr to 30 torr, or higher. A plasma chemistry is developed to result in the etching of a conductive or dielectric film as desired for making a semiconductor device. A chiller system preferably is used to maintain the heat sink at a stable temperature by circulating a coolant through the channels during the entire process. After a wafer has been processed, all process gases and RF voltages are turned off. The backside gas is then turned off and evacuated. At this point, the chucking voltage is turned off to release the wafer. Lift pins are then preferably engaged to lift the wafer and a robotic arm removes the wafer from the process chamber. The cycle of wafer clamping, processing and release are repeated as required. The polyceramic chuck as defined herein can be used in various semiconductor chambers including, for example, conductor or dielectric etch, PVD, CVD, ion implant, metrology, etc.

EXAMPLES

Example 1

In one preferred method of the present invention, the top layer is made from a ceramic aluminum oxide that is at least about 99.5% in purity, with a dielectric constant of from about 8.5 to about 9.5, a resistivity of 1E12 ohm.m. and a breakdown voltage of 22 KV/mm. An electrode comprises tungsten (W) with a resistivity of about 0.06 micro-ohm-m. The preferred electrode can be a single pole, or the electrode is segmented to create poles that are preferably even in number and have equal area and hence equal capacitance. A bottom dielectric is made of a polyceramic layer with a dielectric constant of 3.5, a resistivity of about 1E15 ohm.m and a breakdown voltage of 300 KV/mm. The polyceramic was made of a siloxane compound filled with aluminum oxide. Such an assembly was manufactured and tested on a heat sink made of 6061 T6 aluminum. A 300 mm Si wafer was clamped in a vacuum chamber. Aluminum oxide thermal sprayed layer was used on the exposed surfaces of the heat sink to prevent arcing to the metal base in a plasma chamber.

Example 2

In another preferred assembly method a ceramic aluminum oxide about (99.5%) was used as the top dielectric with a dielectric constant of greater than about 8, a resistivity of 1E15 ohm.m and a breakdown voltage of about 22 KV/mm. An electrode was made from tungsten (W) with a resistivity of 0.06 micro-ohm-m. The bottom dielectric was made of polyimid having a dielectric constant of 3.5, a resistivity of 1E16 ohm.m and a breakdown voltage of 300 KV/mm. Such an assembly was manufactured and tested on a heat sink made of 6061 T6 aluminum. A 300 mm Si wafer was clamped in a vacuum chamber.

In further examples, a chuck was made with the same structure as defined above, where the polymeric filler was boron nitride. In yet further examples, a chuck was made with the same structure as defined above, where the polymeric filler was aluminum nitride.

In still further examples, a chuck was made with a top dielectric made of silicate glass with a dielectric constant of 6.5, with a silver conductor. A fluorocarbon film with a dielectric constant of 2.0 and dielectric strength of 170 KV/mm was used to encapsulate the electrode and bond the top two layers to a metal base comprising 6061 Al. The system was powered as a bipolar chuck and a Si wafer was clamped. Capacitance was measured as 5 nf from power pin to wafer and 2 nf power pin to frame. Capacitance was also measured as 7 nf from the frame to the wafer. When powered up to 2 KV pole to pole, the current draw from the DC power supply was less than 1 μA. The wafer was clamped with a back pressure of 5 torr, and the helium leak rate was less than 1 sccm. The measured time to clamp was less than 1 second, and the time to declamp was also measured at less than 1 second.

In a further experiment, a Si wafer was replaced with GaAs wafer that was 150 mm in diameter. The chuck was able to clamp the wafer at 10 torr nitrogen back pressure with a leak rate of about 2 sccm in a vacuum chamber.

In another example, a polyceramic chuck was bonded to an aluminum heat sink. The aluminum surfaces were kept uncoated. This chuck was tested in a vacuum chamber with RF energy applied to the aluminum frame. A 300 mm Si wafer was clamped on the chuck at 2 KV pole to pole. It was found that there was no current draw when only DC voltages were applied, however, it was found that when RF plasma was ignited, there was excessive current draw from the power supply. This showed a possibility of electrical discharge from the aluminum frame to the ground. In another example, the same polyceramic chuck was bonded to an aluminum heat sink. The aluminum surfaces were coated with a layer of about 250 µm thick aluminum oxide using a thermal spray device. This chuck was again tested in a vacuum chamber with RF energy applied to the aluminum frame. A 300 mm Si wafer was clamped on the chuck at 2 KV pole to pole. It was found that with the presence of the dielectric coating on the aluminum surfaces there was no current draw from the power supplies indicating that there was no discharge from the aluminum frame to the ground. This experiment showed the ability of thermal sprayed dielectric coating to provide an anti-arc capability to the metallic frame.

A polyceramic chuck also was made having a top dielectric layer thickness of about 500 µm, with the conductive layer thickness being about 0.5 µm and the polyceramic layer thickness at about 500 µm. The chuck was made with two concentric electrodes that were rectangular in shape. The chuck was made to clamp a glass substrate used for flat panel display. The glass substrate was deposited with an ITO film. This glass was clamped at 5 KV pole to pole voltage with a clamping force of 10 gms/cm$^2$.

In another example of an embodiment of this invention, an electrostatic chuck with a diameter of about 300 mm was made from 600 µm thick aluminum nitride, having a resistivity of about 1E10 ohm.m, and comprising a conductive layer of deposited tantalum about 1 µm thick. The electrode was then encapsulated with a polyceramic layer, and the assembly was then bonded to an alumina disk that was 6 mm thick. The resistivity of the alumina disk was 1E14 ohm.m. In this configuration, two concentric electrodes of equal area were powered at 1 KV pole to pole and a silicon wafer was clamped in a vacuum chamber. The clamping force was measured by a shear force gauge. The wafer was clamped to a shear force greater than 50N. This structure showed a higher current draw towards the wafer clamping surface, but a very low current draw through the lower dielectric. This exemplifies an advantage of the present invention, whereby the resistivities of the top and lower dielectric can be selected independently to gain certain advantages for a semiconductor tool designer and process.

The top dielectric material was also manufactured using sintered ceramics including, for example, yttrium oxide, silicon nitride and aluminum nitride. The chucks made according to the methods of the present invention may use various ceramics to achieve a dielectric different from that of the top, to encapsulate the electrode which was not possible with the known ceramic or glass-ceramic fused structures.

To enhance heat transfer and reduce transfer of particles from the e-chuck surface to a wafer, various features were added to the top surface. The surface was provided with a flow of a cooling gas such as helium, nitrogen or argon. Gas holes were provided through the three layer structure. The surface of the chuck was provided with radial and circumferential gas grooves to improve gas transport to the entire surface of the chuck in contact with the wafer.

The top dielectric surface also can be textured, along with the presence of gas grooves and holes. Textures were created by machining, eroding and/or etching of the top dielectric surface. Thin dielectric films, such as, for example, DLC, $SiO_2$, AlN, $Al_2O_3$ and $Si_3N_4$ were then deposited on top of the wafer clamping surface to create textures. In one embodiment of the present invention, first the surface of the chuck was coated with SiN. Raised areas were then created with $SiO_2$ to the same height as that of the sealing areas to minimize gas leak rates and reduce particle transfer.

Still further, in accordance with the present invention, and as shown in Table 1 below, electrode materials and configurations can be changed, as can various other features, while still remaining within the spirit of the present teachings. For example, the heat sink can be removed or modified, or can be designed with unique passages for coolants to obtain desired temperature characteristics, such as, for example, enhanced temperature uniformity. Still further, a polyimid flexible heater can be bonded to such an assembly, or a thick film heater can be bonded to such an assembly. In this modular structure, heat may be formed in the heat sink and the polyceramic e-chuck may be bonded to the heat sink. The presence of polyceramic adhesive will preferably provide for a thermal barrier and a dielectric barrier to enhance the temperature uniformity as desired in etch or deposition tools, such as those used in semiconductor processing.

TABLE 1

| Top Dielectric | Middle Conductor | Bottom Dielectric | Heat Sink | Anti Arc |
|---|---|---|---|---|
| $Al_2O_3$ | W | Polymer | Ceramics, | Thermal sprayed $Al_2O_3$, |
| $Al_2O_3{}^+$ | Ta | (polyimide, | e.g., $Al_2O_3$, BN, AlN, | $Y_2O_3$, MgO, $TiO_2$, ZrO |
| $TiO_2$ | Mo | fluorocarbons | SiC, SiN | or combination of |
| $Y_2O_3$ | Al | siloxanes), | Metal or alloy, | oxides, e.g. $Al_2O_3$ + $TiO_2$, |
| MgO | Ag | Ceramic Filled | e.g. Al 6061, T6-4, | etc. |
| ZrO | Cu | Polymer | Inconel, Monel, etc. | Anodized areas, |
| SiN | $Al_xTiO_y$ | | Metal Composites | Polymeric films or rings |
| AlN | Nb | | SiCAl | |
| $SiO_2$ | In | | | |
| SiC | ITO | | | |

While the present invention has been described in detail with reference to specific embodiments thereof, it will be apparent to one skilled in the field that various changes, modifications and substitutions can be made, and equivalents employed without departing from, and are intended to be included within, the scope of the claims.

I claim:

1. An electrostatic chuck for securing work pieces with an electrostatic charge, the chuck comprising:
   a top dielectric layer designed to be in contact with a workpiece, said top layer having a dielectric constant that is from about 5 to about 10, and having a resistivity between about 1E6 ohm.m and about 1E15 ohm.m, the top dielectic layer being in direct contact with an intermediate layer having a resistivity of from about 1.5E-8 ohm.m to about 1 ohm.m, and a bottom polyceramic adhesive layer, selected from the group consisting of: polyimids, fluoropolymers, and siloxanes, wherein said polyceramic adhesive layer having a dielectric constant that is preferably from about 2 to about 7, and having a resistivity of from about 1E12 ohm.m to about 1E15 ohm.m, and wherein the bottom polyceramic adhesive layer is in direct contact with the intermediate layer on one side and a metal layer on the other side, said metal layer comprising a thermal coating of a dielectric material selected from the group consisting of: alumina, yttria, magnesia, titania, zirconium, alloyed dielectric ceramics, and combinations thereof.

2. The electrostatic chuck of claim 1, wherein the intermediate layer is conductive.

3. The electrostatic chuck of claim 1, wherein the work pieces comprise materials selected from the group consisting of: Si, GaAs and glass.

4. The electrostatic chuck of claim 1, wherein the top layer comprises a material selected from the group consisting of: oxides, nitrides, alloys of oxides, alloys of nitrides, and combinations thereof.

5. The electrostatic chuck of claim 1, wherein the top layer comprises a material selected from the group consisting of: aluminum oxide, titanium oxide, silicon dioxide, zirconium oxide, yttrium oxide, beryllium oxide, aluminum nitride, boron nitride, silicon nitride, and combinations thereof.

6. The electrostatic chuck of claim 1, wherein the top layer comprises a material selected from the group consisting of doped ceramics.

7. The electrostatic chuck of claim 1, wherein the bottom layer comprises a polymer having a dielectric constant between about 2 and about 7.

8. The electrostatic chuck of claim 1, wherein the bottom layer comprises a material selected from the group consisting of: polyimide, fluorocarbons, siloxanes, silicon dioxide, glass ceramics, and combinations thereof.

9. The electrostatic chuck of claim 1, wherein the intermediate layer comprises a material selected from the group consisting of: tungsten, titanium, molybdenum, tantalum, silver, copper, aluminum, indium, niobium, ITO, aluminum oxides doped with titanium dioxide, and combinations thereof.

10. The electrostatic chuck of claim 1, wherein the intermediate layer comprises conductive polymers.

11. The electrostatic chuck of claim 1, wherein the bottom layer comprises a polymer material selected from the group consisting of films comprising polyimids, fluoropolymers, and siloxanes.

12. The electrostatic chuck of claim 11, wherein the polymer material is selected from the group consisting of a polymer adhesive, a dielectric polymer gel, a silicone based adhesive, heat or UV curable adhesive, catalytic adhesive, activated adhesive, anaerobic cured adhesive, and combinations thereof.

13. The electrostatic chuck of claim 11, wherein the polymer material comprises a ceramic filled polymer adhesive.

14. The electrostatic chuck of claim 13, wherein the polymer adhesives comprise ceramics selected from the group consisting of: aluminum oxide, silicon dioxide, magnesium oxide, titanium oxide, zirconium oxide, yttrium oxide, aluminum nitride, boron nitride, and combinations thereof.

15. The electrostatic chuck of claim 1 further comprising:
a base adhered to the bottom layer, said base comprising a material selected from the group consisting of: a metal base and a ceramic base.

16. The electrostatic chuck of claim 1, wherein the materials selected for use together as the top, bottom and intermediate layers require no thermal matching to a heat sink.

17. The electrostatic chuck of claim 16, wherein the heat sink comprises aluminum alloys, stainless steel, titanium alloys, nickel and nickel iron base alloys, nickel-copper alloys, copper alloys, graphite, SiCAl, AlN, BN or combinations thereof.

18. The electrostatic chuck of claim 11, wherein the ceramic filled polymer adhesive bonds a metallized ceramic to a metal layer, said metal layer comprising a thermal coating of a dielectric material selected from the group consisting of: alumina, yttria, magnesia, titania, zirconium, alloyed dielectric ceramics, and combinations thereof.

19. The electrostatic chuck of claim 1 comprising at least one feed thru for applying electrical power to at least one electrode.

20. The electrostatic chuck of claim 18, wherein the electrical power is selected from the group consisting of: AC and DC.

21. The electrostatic chuck of claim 1, further comprising a metallic heat sink, wherein said metallic heat sink may be used as a RF electrode.

22. The electrostatic chuck of claim 1, comprising an electrode segmented into substantially equal areas, said electrodes comprising an orientation selected from the group consisting of: concentric and D-shaped electrodes.

23. The electrostatic chuck of claim 22, wherein the electrode comprises dielectric ribs.

24. The electrostatic chuck of claim 22, wherein the electrode is powered with alternate polarity during a wafer clamping cycle.

25. The electrostatic chuck of claim 1, wherein the top, bottom and intermediate layers are bonded to a heat sink without matching thermal expansion characteristics of the top, bottom and intermediate layers.

26. A semiconductor wafer manufacturing process by using the electrostatic chuck of claim 1, wherein the electrostatic chuck comprising:
a top dielectric layer designed to be in contact with a workpiece, said top layer having a dielectric constant that is from about 5 to about 10, and having a resistivity between about 1E6 ohm.m and about 1E15 ohm.m, the top dielectic layer being in direct contact with an intermediate layer having a resistivity of from about 1.5E-8 ohm.m to about 1 ohm.m, and a bottom poly-ceramic adhesive layer selected from the group consisting of: polyimids, fluoropolymers, and siloxanes, wherein the poly-ceramic adhesive layer having a dielectric constant that is preferably from about 2 to about 7 and having resistivity of from 1E12 ohm.m to about 1E15 ohm.m, and wherein the bottom poly-ceramic adhesive layer is in direct contact with the intermediate layer on one side and a metal layer on other side, said metal layer comprising a thermal coating of a dielectric material selected from the ground consisting alumina, yttria, magnesia, titania, zirconium, alloyed dielectric ceramics, and combinations thereof.

27. A semiconductor wafer manufacturing process by using the electrostatic chuck of claim 1, wherein the electrostatic chuck comprising:
a top dielectric layer designed to be in contact with a workpiece, said top layer having a dielectric constant that is from about 5 to about 10, and having a resistivity between about 1E6 ohm.m and about 1E15 ohm.m, the top dielectic layer being in direct contact with an intermediate layer having a resistivity of from about 1.5E-8 ohm.m to about 1 ohm.m, and a bottom poly-ceramic adhesive layer selected from the group consisting of polyimids, fluoropolymers, and siloxanes, wherein the poly-ceramic adhesive layer having a dielectric constant that is preferably from about 2 to about 7 and having resistivity of from 1E12 ohm.m to about 1E15 ohm.m, and wherein the bottom poly-ceramic adhesive layer is in direct contact with the intermediate layer on one side and a metal layer on other side, said metal layer comprising a thermal coating of a dielectric material selected from the ground consisting alumina, yttria, magnesia, titania, zirconium, alloyed dielectric ceramics, and combinations thereof.

28. An electrostatic chuck for securing work pieces with an electrostatic charge, the chuck comprising:

a top dielectric layer designed to be in contact with a workpiece, said top layer having a dielectric constant that is from about 5 to about 10, and having a resistivity between about 1E6 ohm.m and about 1E15 ohm.m, the top dielectic layer being in direct contact with an intermediate layer having a resistivity of from about 1.5E-8 ohm.m to about 1 ohm.m;

a bottom polyceramic adhesive layer having a dielectric constant that is preferably from about 2 to about 7, and having a resistivity of from about 1E12 ohm.m to about 1E15 ohm.m, wherein the bottom polyceramic adhesive layer is in direct contact with the intermediate layer; and said top dielectric ceramic comprising a mesa structure for reducing the contact area to a wafer, wherein the mesa structure is encapsulated with thin films, said thin films comprising a material selected from the group consisting of: carbon, silicon dioxide, silicon nitride, aluminum nitride, siloxanes, polyimids, fluorocarbon-containing compounds, or combinations thereof.

* * * * *